United States Patent [19]

Bobo et al.

[11] Patent Number: 5,356,871
[45] Date of Patent: Oct. 18, 1994

[54] METHOD OF MAKING A SUPERCONDUCTIVE FIBER

[75] Inventors: Jean-Claude Bobo, Orphin; Alain Wicker, Paris, both of France

[73] Assignee: Alcatel Alsthom Compagnie General d'Electricite, Paris Cedex, France

[21] Appl. No.: 895,847

[22] Filed: Jun. 9, 1992

[30] Foreign Application Priority Data

Jun. 10, 1991 [FR] France ................... 91 07028

[51] Int. Cl.$^5$ .................. H01L 39/12; C03C 25/02
[52] U.S. Cl. .................. 505/420; 65/444; 505/430; 505/450; 505/500
[58] Field of Search .................. 264/235, 332; 505/1, 505/725, 739, 740, 704, 742, 782, 420, 430, 434, 450, 500, 501; 65/3.1, 3.11, 3.2

[56] References Cited

U.S. PATENT DOCUMENTS 4,975,416  12/1990  Onishi et al. .................. 505/740
5,158,588  10/1992  Pauling .......................... 505/740

*Primary Examiner*—Christopher A. Fiorilla
*Attorney, Agent, or Firm*—Sughrue, Mion, Zinn, Macpeak & Seas

[57] ABSTRACT

A method of making a high critical temperature superconductive fiber by fiber drawing a material of the family $Bi_x Pb_y Ca_2 Cu_2 Cu_3 O_z$ where $1.9 \leq x+y \leq 2.3$. In the method a preform is made, fiber drawing is performed, and the resulting fiber is annealed in air, wherein said preform is constituted by a block of vitreous material having the formula $Bi_x P_y Sr_2 Ca_2 Cu_3 O_z$ where: $1.9 \leq x+y \leq 2.3$ and a tube surrounding said block and made of a vitreous material having the formula $Bi_{x'} Sr_2 Ca_1 Cu_2 O_{z'}$ with $1.5 \leq x' \leq 2.2$.

2 Claims, 1 Drawing Sheet

METHOD OF MAKING A SUPERCONDUCTIVE FIBER

The present invention relates to a method of making a high critical temperature superconductive fiber by drawing a material in the Bi-Sr-Ca-Cu-O family.

BACKGROUND OF THE INVENTION

Several authors have already mentioned such methods.

The article entitled "Preparation of $Bi_{1.5}$ Sr Ca $Cu_2$ $O_x$ glass fibers using melt-quenched glasses" by M. Onishi et al., published in the Japanese Journal of Applied Physics, Vol. 28, No. 12, December 1989, pp. L 2204–L 2206, describes obtaining a flat fiber of length 120 cm, of width lying in the range 200 $\mu m$ to 1000 $\mu m$, and of thickness lying in the range 25 $\mu m$ to 60 $\mu m$. To do this, a flat preform is prepared of length 20 mm, of width 10 mm, and of thickness 20 mm, by melting the raw materials in a crucible, by quenching, and by annealing. The preform is suspended in an oven with a weight at one of its ends and fiber-drawing is performed. Superconductive properties are not obtained, but the article indicates that annealing should be provided at above 797° C.

The article entitled "Thermal stability and fiber drawing in $Bi_x$ $Pb_y$ $Sr_2$ $Ca_2$ $Cu_3$ $O_z$ glasses" by Takayuki Komatsu et al., published in the Journal of Non-crystalline Solids, 126 (1990), pp. 273–276, investigates various compositions in which $1.6 \leq x \leq 4.0$ and $0.2 \leq y \leq 16$ and it is mentioned that it is possible to draw a fiber from a glass having the following composition $Bi_{2.4}$ $Pb_{0.5}$ $Sr_2$ $Ca_2$ $Cu_3$ $O_z$ or $Bi_{2.7}$ $Pb_{0.4}$ $Sr_2$ $Ca_2$ $Cu_3$ $O_z$.

The raw materials are melted in a platinum crucible in the range 1150° C. to 1250° C.; the material is cast and quenched by being pressed on a metal plate; it is annealed at around 200° C. to 300° C., and a plate-shaped preform is obtained. With a weight at its bottom end, the preform is suspended in an oven heated in the range 550° C. to 600° C., and fiber-drawing is performed The resulting fibers are 50 cm long of width lying in the range 100 $\mu m$ to 200 $\mu m$, and they are 20 $\mu m$ thick. Such fibers are not superconductive and they must be annealed at 840° C. for 100 hours in order to obtain superconductivity with $T_c = 84K$. The authors indicate that optimum annealing conditions could give rise to a temperature $T_c$ greater than 100K, but it is observed that if annealing temperature or time is increased, then there is a danger of vaporizing the lead and of destabilizing the superconductive phase.

The article entitled "Bi-Pb-Sr-Ca-Cu-O superconducting fibers drawn from melt-quenched glass preforms" by M. Onishi et al., published in the Japanese Journal of Applied Physics, Vol. 29, No. 1, January 1990, pp. L 64–L 66, proposes a method analogous to the above method for a composition of the type $Bi_{1.6}$ $Pb_{0.4}$ $Sr_2$ $Ca_2$ $Cu_3$ $O_z$, referred to as "2223 phase". It underlines the fact that the critical temperature increases with increasing annealing temperature of the resulting fiber (e.g. 240 hours in air at 860° C.). The optimum result given relates to a critical temperature $T_c = 68K$ for a material which suffers from the following drawbacks:

a loss of lead which is used as a stabilizer in 2223 phase whose critical temperature $T_c$ is 110K;
a structure that is porous; and
no texturing.

An object of the present invention is to provide a fiber of a material having the composition $Bi_x$ $Pb_y$ $Sr_2$ $Ca_2$ $Cu_3$ $O_z$ by fiber-drawing and having a critical temperature that reaches an optimum value, which is at least greater than 90K.

SUMMARY OF THE INVENTION

The present invention provides a method of making a high critical temperature superconductive fiber by fiber-drawing a material of the family $Bi_x$ $Pb_y$ $Sr_2$ $Ca_2$ $Cu_3$ $O_z$ where $1.9 \leq x+y \leq 2.3$, in which method a preform is made, fiber-drawing is performed, and the resulting fiber is annealed in air, wherein said preform is constituted by a block of vitreous material having the formula $Bi_x$ $Pb_y$ $Sr_2$ $Ca_2$ $Cu_3$ $O_z$ where: $1.9 \leq x+y \leq 2.3$ and a tube surrounding said block and made of a vitreous material having the formula $Bi_{x'}$ $Sr_2$ $Ca_1$ $Cu_2$ $O_{z'}$ with: $1.5 \leq x' \leq 2.2$.

Annealing in air may be performed at 840° C. for 200 hours.

The present invention also provides a superconductive fiber obtained by the above method, and comprising:

a core of superconductive material having a critical temperature greater than 90K, whose formula is $Bi_x$ $Pb_y$ $Sr_2$ $Ca_2$ $Cu_3$ $O_z$, with $1.9 \leq x+y \leq 2.3$; and a sheath of superconducting material having a critical temperature of less than 77K, and whose formula is $Bi_{x'}$ $Sr_2$ $Ca_1$ $Cu_2$ $O_{z'}$ with $1.5 \leq x' \leq 2.2$.

The presence of the sheath makes it possible during annealing to ensure that lead is maintained in the core of the fiber and makes it possible to stabilize the 2223 phase.

In addition, it should be observed that the value of the mean expansion coefficient in the range 20° C. to 600° C. of the sheath material is $12 \times 10^{-5}/°C.$, whereas the coefficient of the core material is estimated as $10 \times 10^{-5}/°C.$. Consequently, during cooling of the fiber, this difference in expansion coefficients gives rise to a mechanical texturing effect which enhances the superconducting current transport properties in the core.

In addition, the fact that the core has a critical temperature that is greater than 90K, while the sheath has a critical temperature that is less than 77K, makes it possible to insulate fibers electrically from one another should they be juxtaposed. The method of the invention makes it possible, merely by the fiber-drawing operation, to provide an electrically insulated superconductive fiber.

BRIEF DESCRIPTION OF THE DRAWING

An embodiment of the invention is described by way of example with reference to the accompanying drawing, in which.

DETAILED DESCRIPTION

The following are mixed together: $Bi_2O_3 + Pb_3O_4 + SrCO_3 + CaCO_3 + CuO$ in the following stoichiometrical proportions:

| Bi | Pb | Sr | Ca | Cu |
|---|---|---|---|---|
| 1.6 | 0.4 | 2 | 3 | — |

About 5 grams (g) of the mixture is melted in a platinum crucible at 1150° C. for 30 minutes. The liquid is cast in a cold brass mold. A rod of vitreous material is obtained having a diameter of about 4 mm and a length of 50 mm, which rod is referred to below as "block 1". Block 1 is subsequently subjected to relaxation annealing at about 250° C. for 12 hours.

The following are mixed together: $Bi_2O_3 + SrCO_3 + CaCO_3 + CuO$ in the following stoichiometrical proportions:

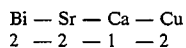

About 5 g of this mixture is melted in a platinum crucible at 1150° C. for 30 minutes. The resulting liquid is cast in a cold brass mold of tubular shape that serves to obtain a tube 2 of vitreous material having an outside diameter of 6 mm, an inside diameter of 4 mm, and a length of about 50 min. The tube 2 is subsequently subjected to relaxation annealing at around 250° C. for 12 hours.

Figure 1:
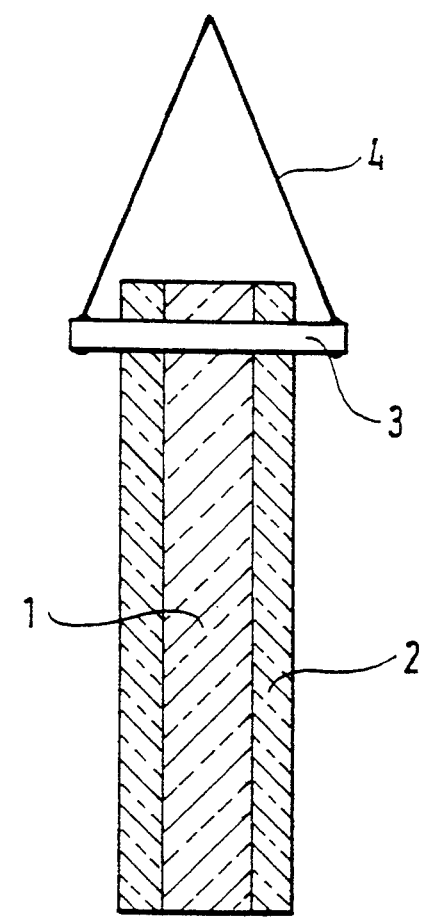
FIG. 1 is a highly diagrammatic representation of a preform used in the method of the invention.
Figure 2:
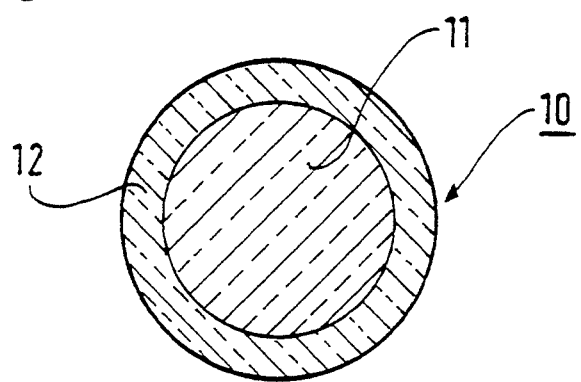
FIG. 2 is an enlarged section through a fiber obtained using the method of the invention.

The assembly comprising the block 1 inside the tube 2 is suspended by means of a platinum wire 4 and a pin 3 (FIG. 1) in an oven (not shown) heated to 550° C. The end of the assembly begins to melt and to lengthen. A fiber 10 is thus obtained having a core 11 and a sheath 12 with the structure shown in FIG. 2. The outside diameter of the sheath 12 is about 120 $\mu$m while the diameter of the core 11 is about 80 $\mu$m.

The fiber is then annealed for 200 hours at 840° C. in air, thereby obtaining a superconductive fiber whose sheath material has a critical temperature of 71K and whose core material has a critical temperature of 94K.

Naturally, the invention is not limited to the embodiment described above. The invention applies to other compositions for the two components of the preform, and the fiber drawing and heat treatment parameters should be modified as a function of said compositions.

We claim:

1. A method of making a high critical temperature superconductive fiber of Bi-Pb-Sr-Ca-Cu-O system, comprising the steps of:

a) melting a first mixture of oxygen-bearing Bi, Pb, Sr, Ca and Cu compounds in relative proportions of x atoms of Bi, y atoms of Pb, 2 atoms of Sr, 2 atoms of Ca, 3 atoms of Cu, with $1.9 < x+y < 2.3$, casting said first melted mixture to obtain a rod of vitreous material, solidifying said rod, and annealing said rod, b) melting a second mixture of oxygen-bearing Bi, Sr, Ca and Cu compounds in relative proportions of x' atoms of Bi, 2 atoms of Sr, 1 atom of Ca, and 2 atoms of Cu, with $1.5 < x' < 2.2$, casting said second melted mixture to obtain a tube of vitreous material, solidifying said tube, and annealing said tube, c) assembling said rod and tube into a preform by placing said rod into said tube, d) drawing said preform into a fiber having a core and a sheath, and e) annealing said fiber in air, whereby said core of said fiber has a critical temperature greater than 90K and the sheath of said fiber has a critical temperature of less than 77K; wherein, during cooling of the fiber, a difference in expansion coefficients of the sheath and the core provides a mechanical texturing effect enhancing superconducting current transport properties of the core; and wherein said drawn fiber is an electrically insulated superconductive fiber.

2. A method according to claim 1, wherein said annealing in air is performed at 840° C. for 200 hours.

* * * * *